(12) United States Patent
Cheng et al.

(10) Patent No.: US 10,131,536 B2
(45) Date of Patent: Nov. 20, 2018

(54) HEATER DESIGN FOR MEMS CHAMBER PRESSURE CONTROL

(71) Applicant: Taiwan Semiconductor Manufacturing Co., Ltd., Hsin-Chu (TW)

(72) Inventors: Shyh-Wei Cheng, Zhudong Township (TW); Chih-Yu Wang, Taichung (TW); Hsi-Cheng Hsu, Taichung (TW); Hsin-Yu Chen, Hsinchu (TW); Ji-Hong Chiang, Changhua (TW); Jui-Chun Weng, Taipei (TW); Wei-Ding Wu, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 46 days.

(21) Appl. No.: 15/176,365

(22) Filed: Jun. 8, 2016

(65) Prior Publication Data
US 2017/0107100 A1    Apr. 20, 2017

Related U.S. Application Data

(60) Provisional application No. 62/243,400, filed on Oct. 19, 2015.

(51) Int. Cl.
*H01L 29/84*     (2006.01)
*B81B 7/00*      (2006.01)
(Continued)

(52) U.S. Cl.
CPC .......... *B81B 7/0041* (2013.01); *B81B 3/0081* (2013.01); *B81C 1/00293* (2013.01);
(Continued)

(58) Field of Classification Search
None
See application file for complete search history.

(56) References Cited

U.S. PATENT DOCUMENTS

2014/0225206 A1*  8/2014  Lin ..................... B81B 7/0038
                                                    257/417
2015/0035089 A1   2/2015  Liu et al.
(Continued)

*Primary Examiner* — Shaun Campbell
(74) *Attorney, Agent, or Firm* — Eschweiler & Potashnik, LLC

(57) ABSTRACT

The present disclosure relates to a MEMs package having a heating element configured to adjust a pressure within a hermetically sealed chamber by inducing out-gassing of into the chamber, and an associated method. In some embodiments, the MEMs package has a CMOS substrate having one or more semiconductor devices arranged within a semiconductor body. A MEMs structure is connected to the CMOS substrate and has a micro-electromechanical (MEMs) device. The CMOS substrate and the MEMs structure form a hermetically sealed chamber abutting the MEMs device. A heating element is electrically coupled to the one or more semiconductor devices and is separated from the hermetically sealed chamber by an out-gassing layer arranged along an interior surface of the hermetically sealed chamber. By operating the heating element to cause the out-gassing layer to release a gas, the pressure of the hermetically sealed chamber can be adjusted after it is formed.

20 Claims, 8 Drawing Sheets

(51) Int. Cl.
*B81B 3/00* (2006.01)
*B81C 1/00* (2006.01)
*H01L 49/02* (2006.01)

(52) U.S. Cl.
CPC ....... *B81B 2207/07* (2013.01); *B81B 2207/09* (2013.01); *B81C 2201/013* (2013.01); *B81C 2203/0109* (2013.01); *B81C 2203/038* (2013.01); *B81C 2203/0735* (2013.01); *H01L 28/20* (2013.01)

(56) References Cited

U.S. PATENT DOCUMENTS

| | | |
|---|---|---|
| 2015/0097215 A1 | 4/2015 | Chu et al. |
| 2015/0097253 A1* | 4/2015 | Tsau ................... B81B 7/0038 257/415 |
| 2015/0111332 A1 | 4/2015 | Lee |
| 2015/0129991 A1* | 5/2015 | Lee ..................... B81B 7/02 257/415 |
| 2015/0158720 A1* | 6/2015 | Lim ................... B81C 1/00285 257/415 |
| 2015/0284240 A1* | 10/2015 | Chu ..................... B81B 7/0041 257/415 |

* cited by examiner

# HEATER DESIGN FOR MEMS CHAMBER PRESSURE CONTROL

REFERENCE TO RELATE APPLICATION

This application claims priority to U.S. Provisional Application No. 62/243,400 filed on Oct. 19, 2015, the contents of which is hereby incorporated by reference in its entirety.

BACKGROUND

In the past decade, micro-electromechanical system (MEMS) devices have become increasingly common in electronic devices (e.g., cell phones, sensors, etc.). MEMS devices include mechanical and electrical features that are able to that sense physical forces or quantities (e.g., acceleration, radiation, etc.) and/or control physical quantities (e.g., fluids). Examples of MEMS devices include microsensors, which convert mechanical signals into electrical signals, and micro-actuators, which convert electrical signals into mechanical signals.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
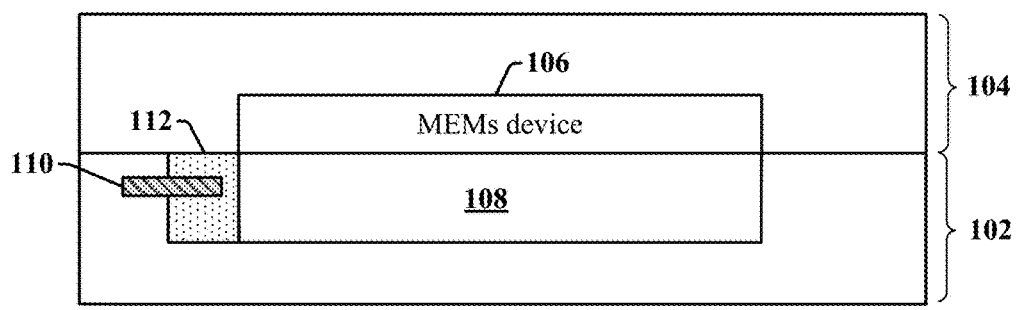
FIG. 1 illustrates some embodiments of a block diagram of a micro-electromechanical system (MEMS) package having a heating element configured to adjust a pressure of a hermetically sealed chamber.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

MEMs devices often operate in a manner that is dependent on an environment surrounding the device. To improve operation of a MEMs device, it may be desirable to operate the MEMs device within a surrounding environment that has a specific pressure that enables improved measurement of a desired parameter. For example, in the case of a MEMs vibrational gyroscope, a surrounding environment having a lower pressure (i.e., a higher vacuum) provides for a better measurement since it enhances displacement that is converted to a signal. Conversely, a MEMs accelerometer uses a higher pressure to mitigate displacement due to background disturbance that is converted to noise.

Therefore, to optimize performance, MEMs devices typically abut hermetically sealed chambers that are held at a controlled pressure level. When there is one type of MEMs device on a wafer, a wafer level capping process can be used to form hermetically sealed chambers held at a desired pressure. However, when there are a plurality of different types of MEMs devices on a same wafer, a wafer level capping process is unable to form hermetically sealed chambers at different pressures using a single capping process (i.e., since such a capping process forms chambers at a same ambient pressure). Furthermore, the use of separate capping processes increases production cost by increasing processing time and a number of processing steps.

The present disclosure relates to micro-electromechanical system (MEMs) package that comprises a heating element configured to adjust a pressure within a hermetically sealed chamber by inducing out-gassing into the chamber, and an associated method. In some embodiments, the MEMs package comprises a CMOS substrate having one or more semiconductor devices arranged within a semiconductor body. A MEMs structure is connected to the CMOS substrate and comprises a micro-electromechanical (MEMs) device. The CMOS substrate and the MEMs structure form a hermetically sealed chamber abutting the MEMs device. A heating element is electrically coupled to the one or more semiconductor devices and is separated from the hermetically sealed chamber by an out-gassing layer arranged along an interior surface of the hermetically sealed chamber. By operating the heating element to cause the out-gassing layer to release a gas, a pressure of the hermetically sealed chamber can be adjusted after it is formed, thereby enabling the formation of hermetically sealed chambers having different pressures within a same substrate.

FIG. 1 illustrates some embodiments of a block diagram of a micro-electromechanical system (MEMS) package 100 having a heating element configured to adjust a pressure of a hermetically sealed chamber.

The MEMS package 100 comprises a CMOS substrate 102 and a MEMs structure 104. The CMOS substrate 102 comprises a plurality of semiconductor devices (e.g., transistors, capacitors, resistors, inductors, diodes, etc.) arranged within a semiconductor body and configured to support operation of the MEMs structure 104. In some embodiments, the CMOS substrate 102 may comprise complementary metal-oxide semiconductor (CMOS) transistors that are configured to provide such functions as analog-to-digital conversion, amplification, storage, filtering, etc. The MEMs structure 104 comprises a MEMs device 106. In various embodiments, the MEMs device 106 may comprise a motion sensor, a pressure sensor, an accelerometer, a gyroscope, or a microphone, for example.

A hermetically sealed chamber 108 is arranged between the CMOS substrate 102 and the MEMs structure 104. The hermetically sealed chamber 108 abuts the MEMs device 106, so that the MEMs device 106 is able to move freely within the hermetically sealed chamber 108. For example, in some embodiments, the MEMs device 106 may comprise a MEMs motion sensor having an ambulatory element configure to move within the hermetically sealed chamber 108 in response to motion of the MEMs package 100.

A heating element 110 is arranged within the CMOS substrate 102. The heating element 110 is separated from the hermetically sealed chamber 108 by an out-gassing layer 112, which is arranged along one or more interior surfaces of the hermetically sealed chamber 108. The out-gassing layer 112 is configured to release a gas when it is heated. In some embodiments, the out-gassing layer 112 may comprise a dielectric layer (e.g., oxide). In some embodiments, the out-gassing layer 112 may comprise a plurality of stacked films.

During operation, the heating element 110 is configured to generate heat, which heats the out-gassing layer 112 and causes the out-gassing layer 112 to release gas into the hermetically sealed chamber 108. The gas released into the hermetically sealed chamber 108 increases a pressure within the hermetically sealed chamber 108. Therefore, the heating element 110 enables the pressure of the hermetically sealed chamber 108 to be tuned after its formation (and without additional processing steps and/or structural damage to the MEMs structure 104 and/or the CMOS substrate 102) by selective heating of the out-gassing layer 112.

Figure 2:
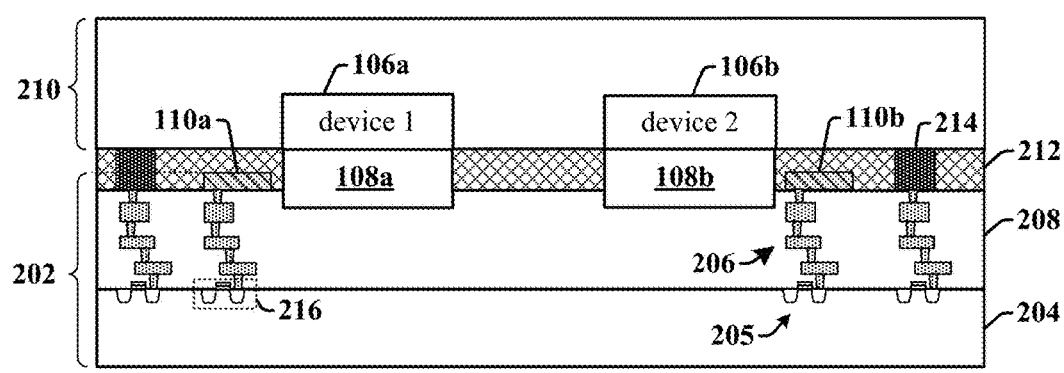
FIGS. 2-4 illustrate some embodiments of cross-sectional views of MEMS packages having a heating element configured to adjust a pressure of a hermetically sealed chamber.

FIG. 2 illustrates some embodiments of a cross-sectional view of a MEMS package 200 having a heating element configured to adjust a pressure of a hermetically sealed chamber.

The MEMs package 200 comprises a CMOS substrate 202 bonded to a MEMs structure 210 by way of an adhesive layer 212 (e.g., an oxide) arranged therebetween. In some embodiments, a conductive bonding structure 214, arranged between the CMOS substrate 202 and the MEMs structure 210, provides an electrical connection between the CMOS substrate 202 and the MEMs structure 210. In some embodiments, the CMOS substrate 202 comprises a semiconductor body 204 and an overlying back-end-of-the-line (BEOL) metallization stack. A plurality of transistor devices 205 are arranged within the semiconductor body 204. The BEOL metallization stack comprises a plurality of metal interconnect layers 206 (e.g., metal contacts, metal interconnect wires, and metal interconnect vias) arranged within a dielectric structure 208 comprising one or more layers of dielectric material.

A plurality of hermetically sealed chambers 108a-108b are arranged between the CMOS substrate 202 and the MEMs structure 210. The plurality of hermetically sealed chambers 108a-108b abut MEMs devices 106a-106b (e.g., a motion sensor, a pressure sensor, an accelerometer, a gyroscope, a microphone, etc.) arranged within the MEMs structure 210. The MEMs devices 106a-106b comprise ambulatory elements configured to move within the hermetically sealed chambers 108a-108b.

Heating elements 110a-110b are arranged within the CMOS substrate 202. The heating elements 110a-110b are respectively located at a position that is closer to one of the plurality of hermetically sealed chambers 108a-108b. For example, a first heating element 110a is closer to a first hermetically sealed chamber 108a than to a second hermetically sealed chamber 108b, while a second heating element 110b is closer to a second hermetically sealed chamber 108b than to the first hermetically sealed chamber 108a. In some embodiments, the heating elements 110a-110b may be arranged within the adhesive layer 212.

The heating elements 110a-110b are in thermal communication with the plurality of hermetically sealed chambers 108a-108b (i.e., the heating elements 110a-110b generate heat that increases a temperature of the hermetically sealed chambers 108a-108b). The heating elements 110a-110b are configured to heat the adhesive layer 212 to cause the adhesive layer 212 to outgas into an adjacent chamber. For example, the first heating element 110a causes the adhesive layer 212 to outgas into the first hermetically sealed chamber 108a and the second heating element 110b causes the adhesive layer 212 to outgas into the second hermetically sealed chamber 108b.

In some embodiments, the heating elements 110a-110b are coupled to current sources 216 located within the CMOS substrate 302. The current sources 216 are configured to provide a current to the heating elements 110a-110b. The current causes the heating elements 110a-110b to dissipate heat based upon the provided current. In some embodiments, the current sources 214 may comprise one or more transistor devices 205 arranged within the semiconductor body 204.

Figure 3:
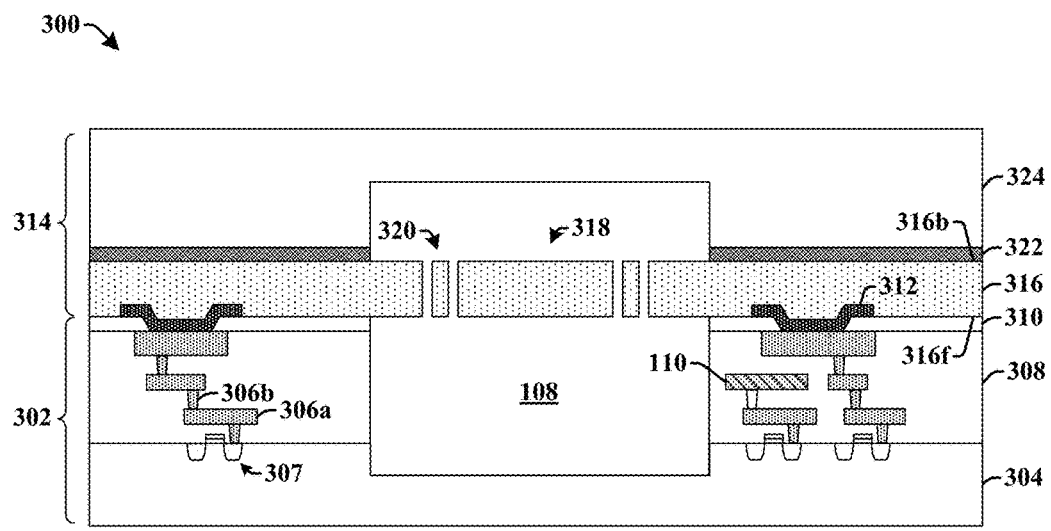

FIG. 3 illustrates some embodiments of a cross-sectional view of a MEMS package 300 having a heating element configured to adjust a pressure of a hermetically sealed chamber.

The MEMs package 300 comprises a CMOS substrate 302 and a MEMS structure 314. The CMOS substrate 302 comprises a semiconductor body 304 having one or more transistor devices 307 and an overlying dielectric structure 308 having metal interconnect layers 306a-306b. In some embodiments, the metal interconnect layers comprise a metal interconnect wire 306a and a metal via 306b. The metal interconnect layers, 306a and 306b, are connected to one or more bond pads 312 located along an upper surface of the CMOS substrate 302. In some embodiments, the bond pads 312 laterally abut a dielectric material 310. In some embodiments, the dielectric material 310 may be a part of the dielectric structure 308.

The MEMs structure 314 comprises a MEMs substrate 316 and a capping substrate 324. A front-side 316f of the MEMs substrate 316 contacts the one or more bond pads 312. A back-side 316b of the MEMs substrate 316 is coupled to the capping substrate 324 by way of a bonding layer 322 (e.g., a dielectric layer). The MEMs substrate 316 comprises an ambulatory element 318 (e.g., a proof mass, a flexible membrane, etc.). The capping substrate 324 comprises a depression arranged at a position abutting the ambulatory element 318. In some embodiments, the capping substrate 324 comprises a semiconductor material that continually extends along sidewalls and lateral surfaces of the depression.

In some embodiments, the MEMs substrate 316 comprises a silicon substrate doped to have a p-type doping or an n-type doping, while the capping substrate 324 comprises a silicon substrate. In other embodiments, the MEMs substrate 316 may comprise polysilicon. In some embodiments, the capping substrate 324 further includes anti-stiction bumps (not shown) protruding from a lateral surface of the depression and configured to reduce stiction between the capping substrate 324 and the ambulatory element 318.

A hermetically sealed chamber 108 is arranged between the CMOS substrate 302 and the MEMs structure 314. In some embodiments, the hermetically sealed chamber 108 extends from the depression within the capping substrate 324 to a location within the semiconductor body 304. The ambulatory element 318 is arranged within the hermetically sealed chamber 108. The ambulatory element 318 is configured to move within the hermetically sealed chamber 108 in response to an external stimuli (e.g., a motion of the MEMs package 300, a sound wave, a change in pressure, etc.) and to generate an electrical output signal that correlates to the external stimuli. In some embodiments, the ambulatory element 318 may be connected to one or more springs 320, which allow the ambulatory element 318 to move.

A heating element 110 is arranged within the dielectric structure 308. The heating element 110 is separated from the hermetically sealed chamber 108 by the dielectric structure 308. In some embodiments, the heating element 110 may be arranged at a position that is laterally offset from the hermetically sealed chamber 108. In some embodiments, the heating element 110 is not laterally separated from the hermetically sealed chamber 108 by the one or more metal interconnect layers 306a-306b (i.e., the metal interconnect layers 306a-306b are not between the hermetically sealed chamber 108 and the heating element 110).

The heating element 110 is configured to generate heat, which causes the dielectric structure 308 to release a gas into the hermetically sealed chamber 108. The heating element 110 is connected to a transistor device 307 within the semiconductor body 304 by way of the one or more metal interconnect layers, 306a and 306b. The transistor device 307 is configured to generate a signal that control operation of the heating element 110. In various embodiments, the heating element 110 may comprise a resistive element connected to a current source comprising a transistor device 307 located within the semiconductor body 304. In such embodiments, the heating element 110 is configured to dissipate heat when a current is provided through it. For example, the heating element 110 may comprise a polysilicon resistor, a thin film resistor, or a thick film resistor.

Figure 4:
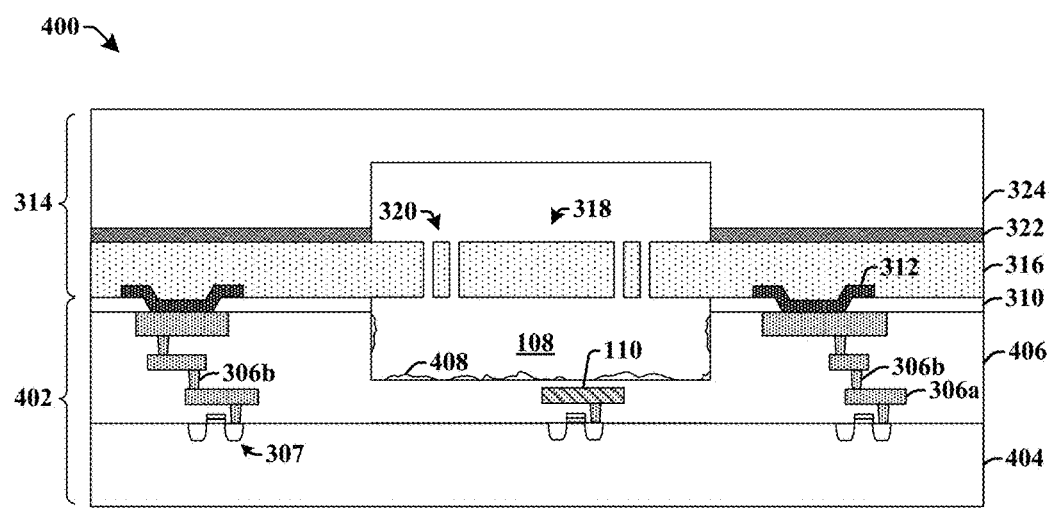

FIG. 4 illustrates some additional embodiments of a cross-sectional view of a MEMS package 400 having a heating element configured to adjust a pressure of a hermetically sealed chamber.

The MEMs package 400 comprises a CMOS substrate 402 and a MEMS structure 314. The CMOS substrate 402 comprises a semiconductor body 404 having one or more transistor devices 307 and an overlying dielectric structure 406 having one or more metal interconnect layers 306a-306b. A hermetically sealed chamber 108 is arranged between the CMOS substrate 402 and the MEMs structure 314. The hermetically sealed chamber 108 extends from an upper surface of the CMOS substrate 402 to a location within the dielectric structure 308 that is vertically separated from the semiconductor body 304.

A residue film 408 is arranged along a portion of one or more interior surfaces of the hermetically sealed chamber 108. The residue film 408 comprises a residue from processes used to form the MEMs package 400. For example, the residue film 408 may comprise a residue from an etching process or a planarization process (e.g., a chemical mechanical polishing process). In various embodiments, the residue film 408 may comprise a metal (e.g., titanium nitride) or a dielectric (e.g., an oxide).

A heating element 110 is arranged within the dielectric structure 406, at a location that is separated from the hermetically sealed chamber 108 by the dielectric structure 406 and the residue film 408. In some embodiments, the heating element 110 may be arranged at a position that is vertically between the hermetically sealed chamber 108 and the semiconductor body 304. The heating element 110 is configured to generate heat, which causes the residue film 408 and/or the dielectric structure 308 to release a gas into the hermetically sealed chamber 108 to adjust a pressure of the hermetically sealed chamber 108.

FIGS. 5-15 illustrate some embodiments of cross-sectional views 500-1500 showing a method of forming a micro-electromechanical system (MEMS) package having a heating element configured to adjust a pressure within a hermetically sealed chamber.

Figure 5:
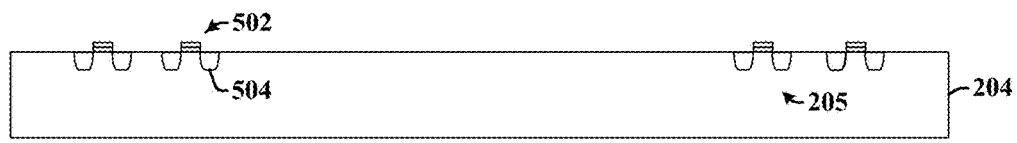
FIGS. 5-15 illustrate some embodiments of cross-sectional views showing a method of forming a MEMS package having a heating element configured to adjust a pressure of a hermetically sealed chamber.

As shown in cross-sectional view 500 of FIG. 5, a semiconductor body 204 is provided. In various embodiments, the semiconductor body 204 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith.

One or more transistor devices 205 are formed within the semiconductor body 204. In some embodiments, the one or more transistor devices 205 may be formed by forming a gate dielectric layer over the semiconductor body 204 and a gate electrode layer over the gate dielectric layer. The gate dielectric layer and the gate electrode layer are subsequently patterned to define a gate structure 502. An implantation process may be performed after defining the gate structure 502 to form source/drain regions 504 within the semiconductor body 204. The source/drain regions 504 have a higher doping concentration than the semiconductor body 204.

Figure 6:
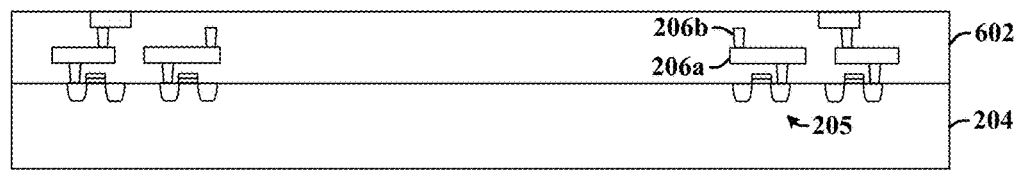

As shown in cross-sectional view 600 of FIG. 6, a plurality of metal interconnect layers 206a-206b are formed within a dielectric structure 602 arranged over the semiconductor body 204. The plurality of metal interconnect layers may comprise alternating layers of metal interconnect wires 206a and metal vias 206b surrounded by one or more inter-level dielectric layers within the dielectric structure 602.

In some embodiments, the plurality of metal interconnect layers 206a-206b may be formed by forming a dielectric structure 602 over the semiconductor body 204. The dielectric structure 602 may comprise a low-k dielectric layer, an ultra low-k dielectric layer, an extreme low-k dielectric layer, and/or a silicon dioxide layer. The dielectric structure 602 is selectively exposed to an etchant (e.g., $CF_4$, $CHF_3$, $C_4F_8$, HF, etc.) that etches the dielectric structure 602 to form a plurality of via holes and metal trenches. A conductive material (e.g., copper, aluminum, tungsten, etc.) is formed within the plurality of via holes and metal trenches. In some embodiments, a chemical mechanical polishing (CMP) process may be used to remove excess of the metal material from a top surface of the dielectric structure 602.

Figure 7:
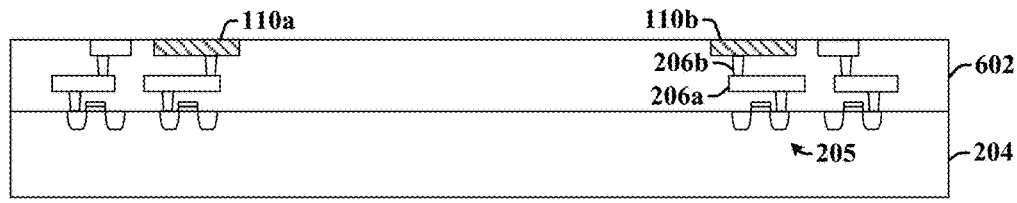

As shown in cross-sectional view 700 of FIG. 7, heating elements 110a-110b are formed over the semiconductor body 204. The heating elements 110a-110b are electrically coupled to a transistor device 205 within the semiconductor body 204 by way of one or more of the plurality of metal interconnect layers 206a-206b. In some embodiments, the heating elements 110a-110b may comprise a high-resistivity material that radiates heat when a current is applied. For example, the heating elements 110a-110b may comprise a polysilicon resistor, a thin film resistor, or some other similar resistive element.

Figure 8:
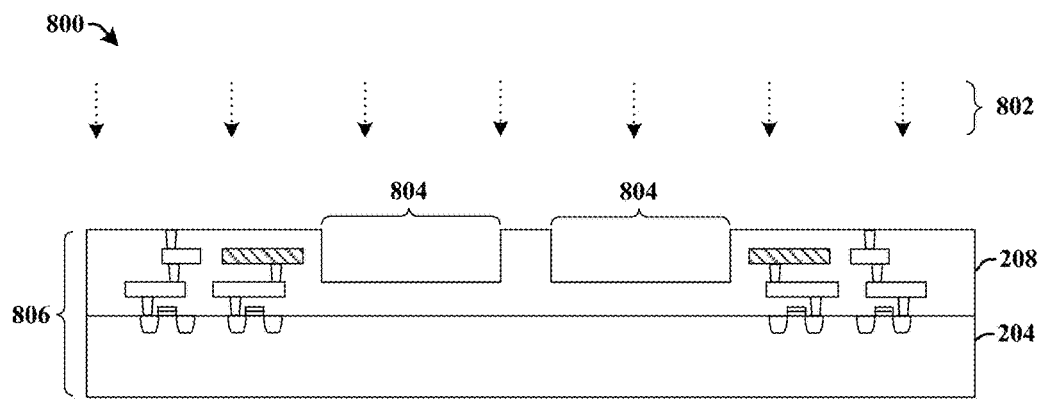

As shown in cross-sectional view 800 of FIG. 8, the dielectric structure 208 is selectively exposed to a first etchant 802 configured to form one or more recesses 804 within an upper surface of a CMOS substrate 806. The one or more recesses 804 extend from the upper surface of the CMOS substrate 806 to within the dielectric structure 208. In some embodiments, the one or more recesses 804 may further extend into the semiconductor body 204.

Figure 9:
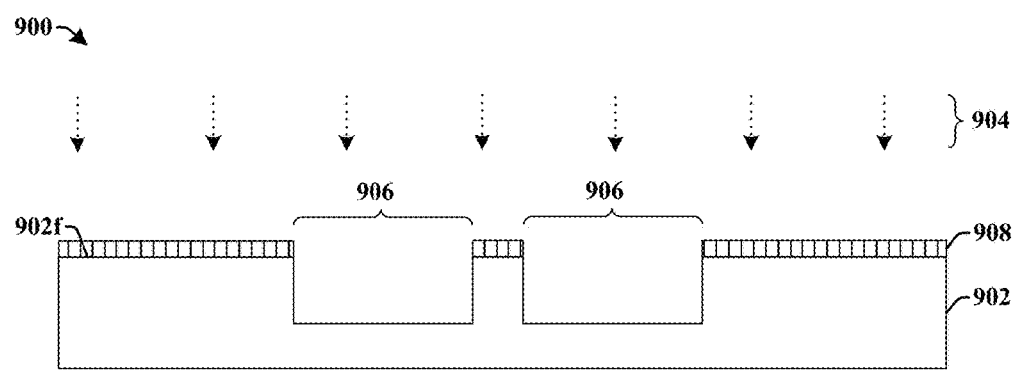

As shown in cross-sectional view 900 of FIG. 9, a capping substrate 902 is selectively exposed to a second etchant 904 that is configured to form depressions 906 within a front-side 902f of the capping substrate 902. In some embodiments, the capping substrate 902 may be etched by forming a first masking layer 908 onto the capping substrate 902 and subsequently exposing the capping substrate 902 to the second etchant 904. In various embodiments, the first masking layer 908 may comprise a photoresist or a nitride (e.g., SiN) patterned using a photolithography process. In various embodiments, the second etchant 904 may comprise a dry etchant have an etching chemistry comprising a fluorine species (e.g., $CF_4$, $CHF_3$, $C_4F_8$, etc.) or a wet etchant (e.g., hydroflouric acid (HF) or Tetramethylammonium hydroxide (TMAH)).

Figure 10:
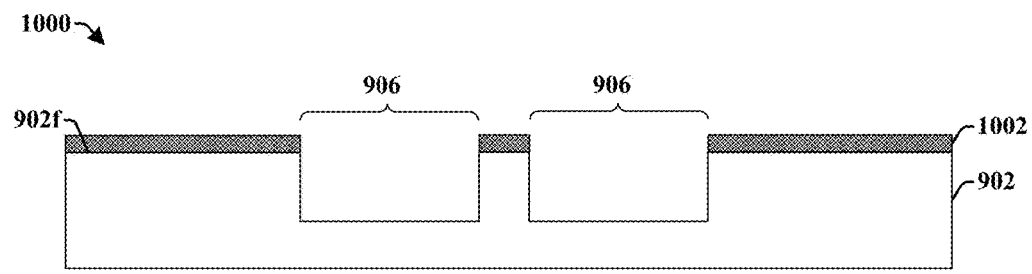

As shown in cross-sectional view 1000 of FIG. 10, a dielectric layer 1002 (e.g., $SiO_2$) is formed along the front-side 902f of the capping substrate 902. In some embodiments, the dielectric layer 1002 comprises an oxide (e.g., $SiO_2$) formed by way of a thermal process. In other embodiments, the dielectric layer 1002 comprises an oxide (e.g., $SiO_2$) formed by way of a deposition process (e.g., chemical vapor deposition (CVD), physical vapor deposition (PVD), atomic layer deposition (ALD), etc.). In some embodiments, the dielectric may extend to positions within the depressions 906

Figure 11:
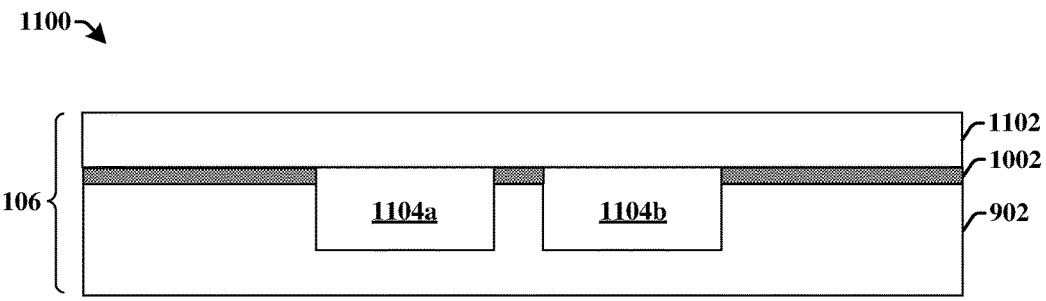

As shown in cross-sectional view 1100 of FIG. 11, a MEMs substrate 1102 is bonded to the dielectric layer 1002 to form a MEMs structure 1106. In some embodiments, the bonding process may comprise a fusion bonding process. In some embodiments, the MEMs substrate 1102 may comprise a silicon substrate having a doping concentration that makes the MEMs substrate 1102 conductive (e.g., having a p-type doping concentration). In other embodiments, the MEMs substrate 1102 may comprise polysilicon. Bonding the MEMs substrate 1102 to the dielectric layer 1002 forms one or more cavities 1104a-1104b arranged between the capping substrate 902 and the MEMs substrate 1102.

Figure 12:
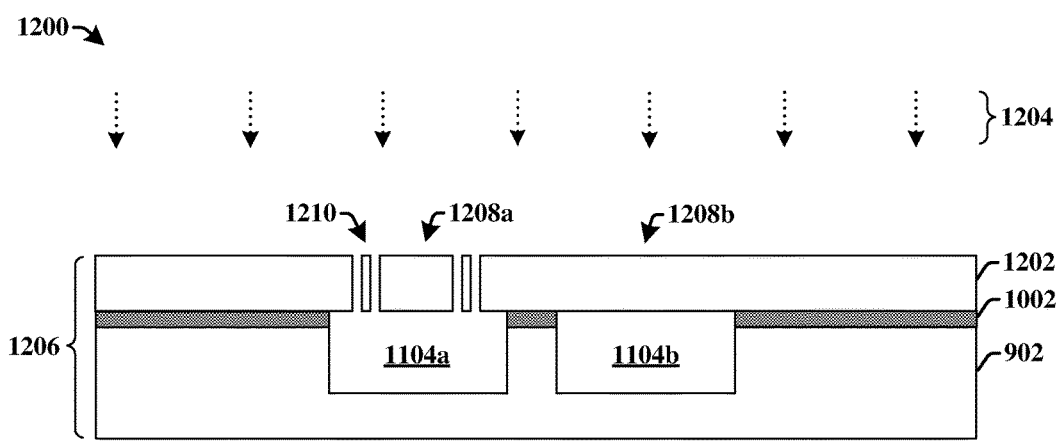

As shown in cross-sectional view 1200 of FIG. 12, the MEMs substrate 1202 may be selectively exposed to a third etchant 1204. The third etchant 1204 etches the MEMs substrate 1202 to form openings that extend through the MEMs substrate 1202, resulting in a MEMs structure 1206 having a first ambulatory element 1208a and a second ambulatory element 1208b. In some embodiments, the first ambulatory element 1208a may be connected to one or more springs 1210, which allow the first ambulatory element 1208a to move. In various embodiments, the third etchant 1204 may comprise a dry etchant have an etching chemistry comprising a fluorine species (e.g., $CF_4$, $CHF_3$, $C_4F_8$, etc.) or a wet etchant (e.g., hydroflouric acid (HF) or Tetramethylammonium hydroxide (TMAH)).

As shown in cross-sectional view 1300, the MEMs structure 1206 is bonded to the CMOS substrate 806 at a first ambient pressure $P_1$ (e.g., a pressure of the processing chamber in which the bonding occurs). Bonding the MEMs structure 1206 to the CMOS substrate 806 forms a first hermetically sealed chamber 1302a and a second hermetically sealed chamber 1302b, which are held at the first ambient pressure $P_1$.

In some embodiments, the MEMs structure 1206 is bonded to the CMOS substrate 806 by way of a eutectic bonding process (along an interface between a conductive bonding pad 1304 and a eutectic bonding layer 1306). In such embodiments, prior to bonding a conductive bond pad 1304 may formed onto the dielectric structure 208 and a eutectic bonding layer 1306 may be formed onto the MEMs substrate 1102. The conductive bond pad 1304 may comprise an aluminum bond pad formed over the dielectric structure 208 and electrically coupled to a transistor device 205 by way of one or more of the plurality of metal interconnect layers 206a-206b. The eutectic bonding layer 1306 may comprise a germanium layer or an aluminum layer. In various embodiments, the eutectic bonding layer 1306 may be formed by way of a deposition process (e.g., chemical vapor deposition (CVD), physical vapor deposition (PVD), atomic layer deposition (ALD), etc.).

Figure 14:
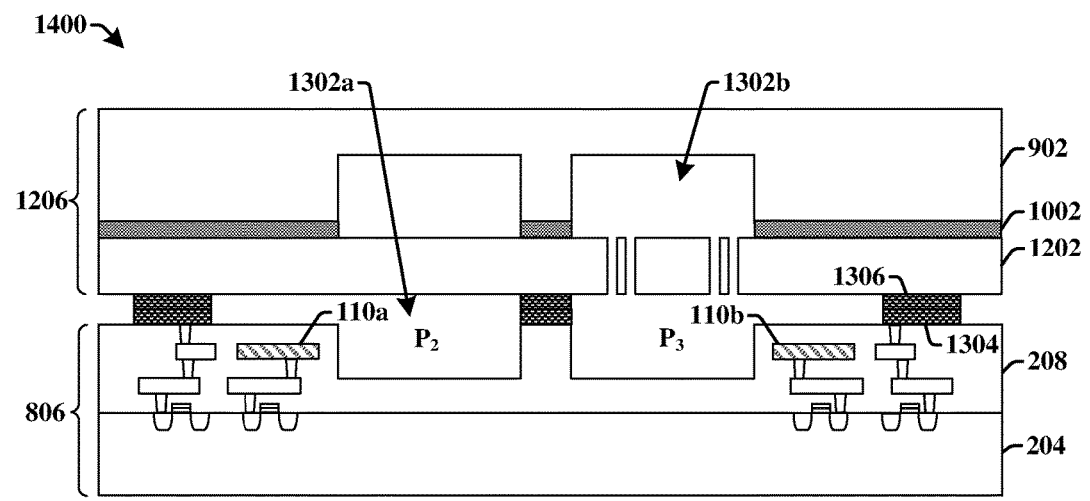

As shown in cross-sectional view 1400 of FIG. 14, the first heating element 110a and/or the second heating element 110b are activated to change a pressure within the first hermetically sealed chamber 1302a and/or the second hermetically sealed chamber 1302b. For example, a first signal (e.g., current) may be provided to the first heating element 110a, causing the first heating element 110a to increase a pressure within the first hermetically sealed chamber 1302a to a second pressure value $P_2$ (greater than the first ambient pressure $P_1$). A second signal (e.g., current) may be provided to the second heating element 110b, causing the second heating element 110b to generate a heat that causes the dielectric structure 208 to outgas and increase a pressure within the second hermetically sealed chamber 1302b to a third pressure value $P_3$ (greater than the first ambient pressure $P_1$).

Figure 15:
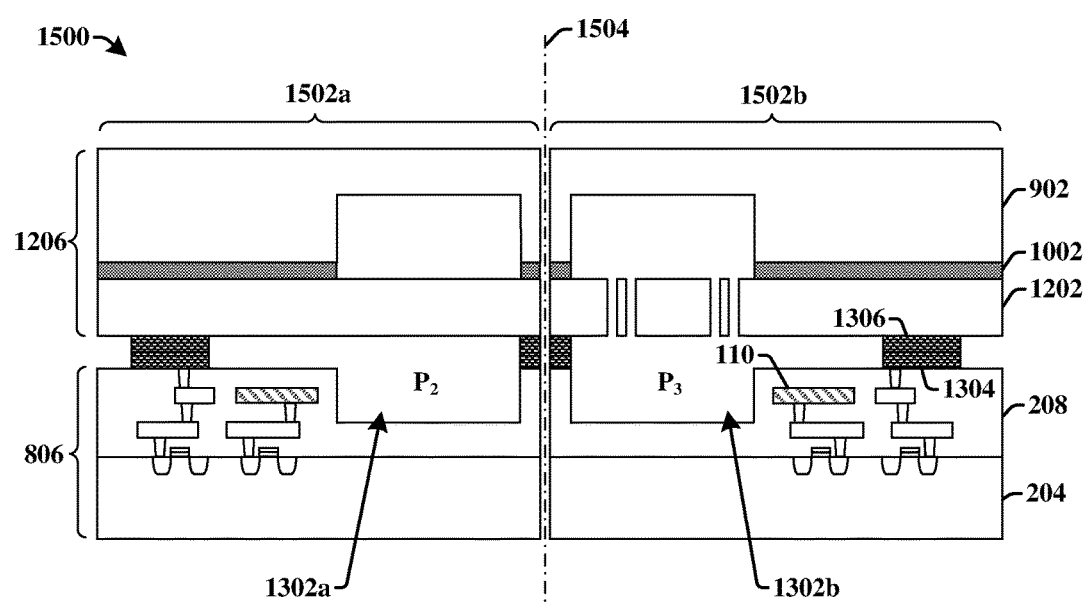

As shown in cross-sectional view 1500 of FIG. 15, the CMOS substrate 806 and the MEMs structure 1206 may be diced along one or more of scribe lines 1504 to form a first die 1502a and a second die 1502b. The first die 1502a comprises a first MEMs device abutting the first hermetically sealed chamber 1302a having the second pressure $P_2$. The second die 1502b comprises a second MEMs devices abutting the second hermetically sealed chamber 1302b having the third pressure $P_3$.

Figure 16:
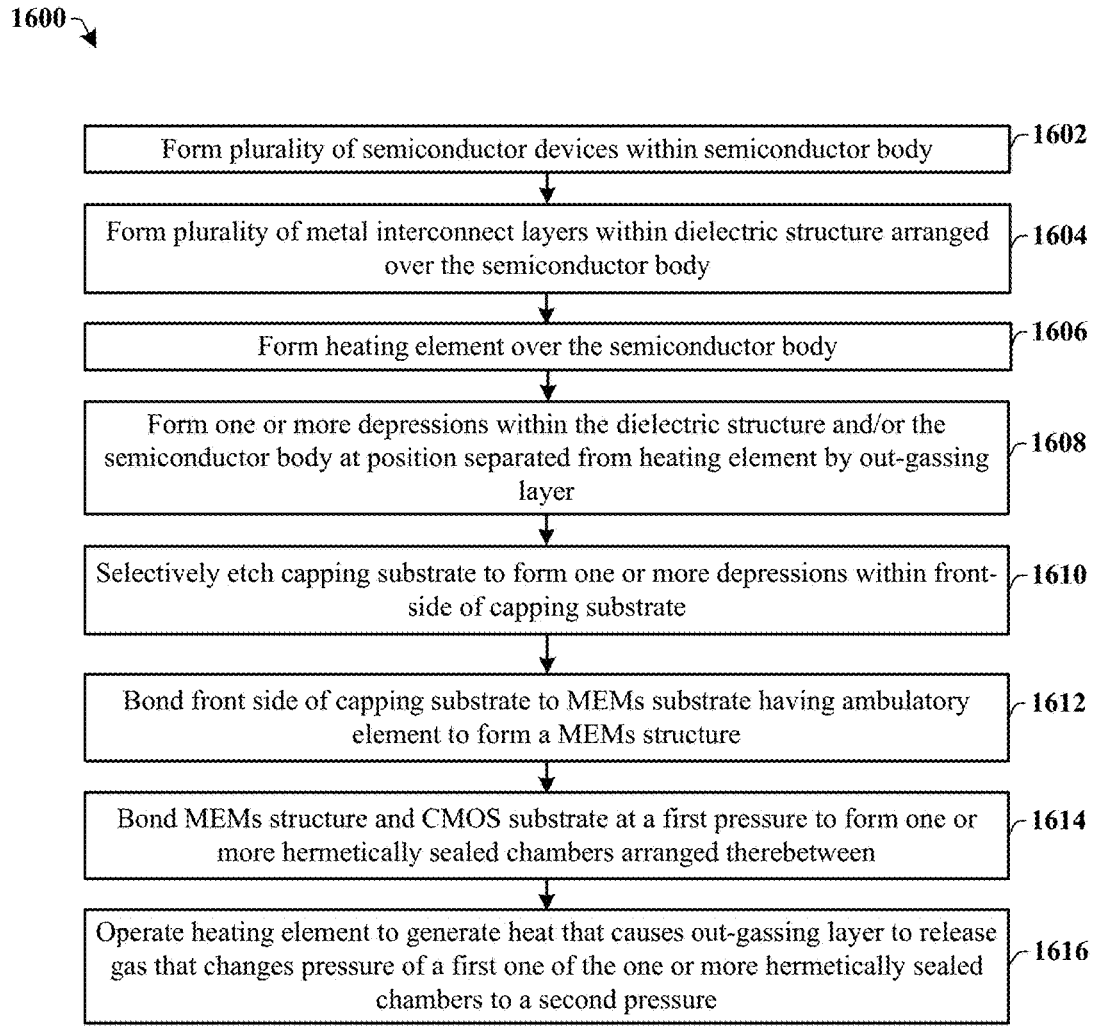
FIG. 16 illustrates a flow diagram of some embodiments of a method of forming a MEMS package having a heating element configured to adjust a pressure of a hermetically sealed chamber.

FIG. 16 illustrates some embodiments of a method 1600 of forming a micro-electromechanical system (MEMS) package having a heating element configured to adjust a pressure of a hermetically sealed chamber. Although method 1600 is described in relation to FIGS. 5-15, it will be appreciated that the method 1600 is not limited to such structures.

Furthermore, while the disclosed method 1600 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1602, a plurality of semiconductor devices are formed within a semiconductor body. FIG. 5 illustrates some embodiments of a cross-sectional view 500 corresponding to act 1602.

At 1604, a plurality of metal interconnect layers are formed within a dielectric structure arranged over the semiconductor body. FIG. 6 illustrates some embodiments of a cross-sectional view 600 corresponding to act 1604.

At 1606, a heating element is formed over the semiconductor body FIG. 7 illustrates some embodiments of a cross-sectional view 700 corresponding to act 1606.

At 1608, one or more depressions are formed within the dielectric structure and/or the semiconductor body. The one or more depressions are separated from the heating element by an out-gassing layer. FIG. 8 illustrates some embodiments of a cross-sectional view 800 corresponding to act 1608.

At 1610, a capping substrate is selectively etched to form one or more depressions within a front-side of a capping substrate. FIG. 9 illustrates some embodiments of a cross-sectional view 900 corresponding to act 1610.

At 1612, the front side of the capping substrate is bonded to a MEMs substrate having an ambulatory element. FIGS. 10-12 illustrate some embodiments of cross-sectional views 1000-1200 corresponding to act 1612.

Figure 13:
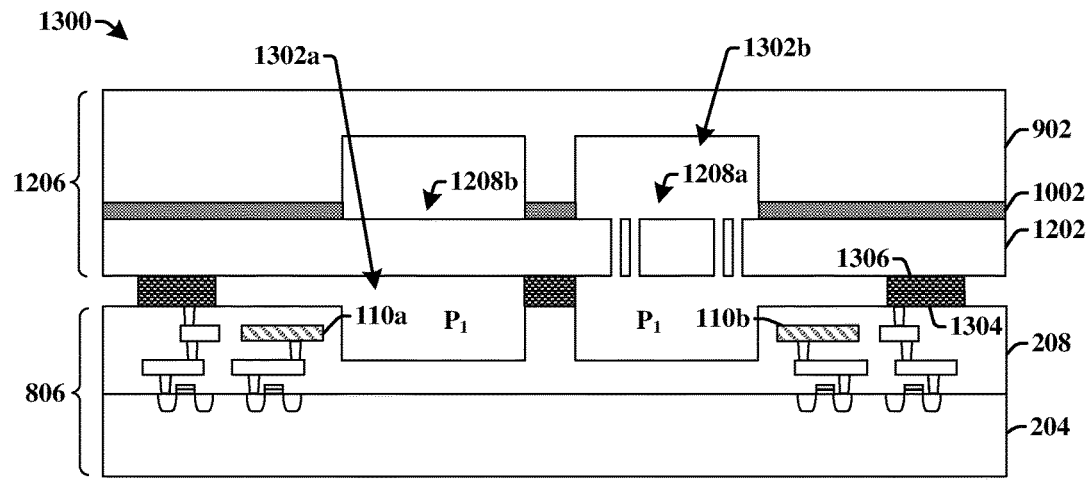

At 1614, the MEMs substrate is bonded to the CMOS substrate at a first pressure to form one or more hermetically sealed chambers arranged therebetween. FIG. 13 illustrates some embodiments of a cross-sectional view 1300 corresponding to act 1614.

At 1616, the heating element is operated to generate heat that causes out-gassing layer to release gas that changes pressure of a first one of the one or more hermetically sealed chambers to a second pressure greater than the first pressure. FIG. 14 illustrates some embodiments of a cross-sectional view 1400 corresponding to act 1616.

Therefore, the present disclosure relates to micro-electromechanical system (MEMs) package that comprises a heating element configured to adjust a pressure within a hermetically sealed chamber by inducing out-gassing of dielectric materials, and an associated method.

In some embodiments, the present disclosure relates to a micro-electromechanical system (MEMs) package. The MEMs package comprises a CMOS substrate having one or more semiconductor devices arranged within a semiconductor body. The MEMs package further comprises a MEMs structure connected to the CMOS substrate and comprising a micro-electromechanical (MEMs) device. The MEMs package further comprises a hermetically sealed chamber abutting the MEMs device is arranged between the CMOS substrate and the MEMs structure. A heating element is electrically coupled to the one or more semiconductor devices and separated from the hermetically sealed chamber by an out-gassing layer arranged along an interior surface of the hermetically sealed chamber.

In other embodiments, the present disclosure relates to a micro-electromechanical system (MEMs) package. The MEMs package comprises a CMOS substrate having one or more semiconductor devices arranged within a semiconductor body and an overlying dielectric structure having one or more metal interconnect layers and a first depression. The MEMs package further comprises a capping substrate arranged over the CMOS substrate and comprising a second depression, which along with the first depression forms a hermetically sealed chamber arranged between the capping substrate and the CMOS substrate. The MEMs package further comprises a MEMS substrate arranged between the capping substrate and the CMOS substrate and comprising an ambulatory element located within the hermetically sealed chamber. The MEMs package further comprises a heating element electrically coupled to the one or more semiconductor devices and arranged within the dielectric structure at a location that is in thermal communication with the hermetically sealed chamber.

In yet other embodiments, the present disclosure relates to a method of forming a MEMs substrate. The method comprises forming a CMOS substrate having a heating element over a semiconductor body, and forming a MEMs structure having a plurality of MEMs devices. The method further comprises bonding the MEMs structure to the CMOS substrate at a first pressure to form a plurality of hermetically sealed chambers arranged between the MEMs structure and the CMOS substrate. A first one of the plurality of hermetically sealed chambers is separated from the heating element by an out-gassing layer. The method further comprises operating the heating element to generate heat that causes out-gassing layer to release gas that changes the first pressure of the first one of the plurality of hermetically sealed chambers to a second pressure that is greater than the first pressure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a micro-electromechanical system (MEMs) substrate, comprising:
   forming a complementary metal-oxide semiconductor (CMOS) substrate having a first heating element and a second heating element over a semiconductor body;
   forming a MEMs structure having a plurality of MEMs devices;
   bonding the MEMs structure to the CMOS substrate at a first pressure to form a plurality of hermetically sealed chambers arranged between the MEMs structure and the CMOS substrate, wherein a first one of the plurality of hermetically sealed chambers is separated from the first heating element by an out-gassing layer and a second one of the plurality of hermetically sealed chambers is separated from the second heating element by the out-gassing layer, wherein the out-gassing layer comprises a residue from an etching process or a planarization process;
   operating the first heating element to generate heat that causes the out-gassing layer to release a first gas that changes the first pressure within the first one of the plurality of hermetically sealed chambers to a second pressure that is greater than the first pressure; and
   operating the second heating element to generate heat that causes the out-gassing layer to release a second gas that changes the first pressure within the second one of the plurality of hermetically sealed chambers to a third pressure that is greater than the first pressure and the second pressure.

2. The method of claim 1, further comprising:
forming a plurality of semiconductor devices within the semiconductor body;
forming a plurality of metal interconnect layers within a dielectric structure arranged over the semiconductor body;
forming a plurality of depressions within the dielectric structure, wherein the plurality of depressions form a part of the plurality of hermetically sealed chambers;
wherein the first heating element is arranged within the dielectric structure; and
wherein a horizontal plane extends through the first heating element and sidewalls of the dielectric structure that define the first one of the plurality of hermetically sealed chambers and the second one of the plurality of hermetically sealed chambers.

3. The method of claim 1, further comprising:
dicing the MEMs structure and the CMOS substrate, after bonding, to form a first die comprising a first MEMs device abutting the first one of the plurality of hermetically sealed chambers having the second pressure and a second die comprising a second MEMs devices abutting the second one of the plurality of hermetically sealed chambers having the third pressure.

4. The method of claim 1, wherein the first heating element directly contacts the out-gassing layer and comprises a polysilicon resistor, a thin film resistor, or a thick film resistor.

5. A method of forming micro-electromechanical system (MEMs) devices, comprising:
forming a first recess and a second recess respectively defined by one or more sidewalls of a dielectric structure over a substrate;
forming a heating element directly contacting an out-gassing layer abutting the first recess;
bringing a first ambulatory element of a first MEMs device into contact with the first recess and a second ambulatory element of a second MEMs device into contact with the second recess, wherein the first MEMs device and the second MEMs device are comprised within a MEMS substrate having a substantially flat upper surface that continually extends from directly over the heating element to past opposing sides of the heating element;
forming an adhesive layer over the substrate, wherein the adhesive layer is configured to bond the MEMs substrate to the substrate and wherein the adhesive layer is the out-gassing layer;
hermetically sealing the first recess to form a first chamber and the second recess to form a second chamber;
operating the heating element to generate heat that causes the out-gassing layer to release a gas that increases a first pressure within the first chamber to be greater than a second pressure within the second chamber; and
dicing the substrate into a first die having the first MEMs device and a second die having the second MEMs device after operating the heating element.

6. The method of claim 5, further comprising:
bonding a capping substrate to the MEMs substrate comprising the first MEMs device and the second MEMs device, wherein the capping substrate comprises a semiconductor material that continually extends along a lateral surface and along sidewalls of the first chamber and the second chamber.

7. The method of claim 5, wherein the first chamber is directly between the heating element and the MEMs substrate.

8. The method of claim 5, wherein increasing the first pressure within the first chamber improves performance of the first MEMs device.

9. The method of claim 5, wherein the first MEMs device and the second MEMs device are different types of MEMs devices.

10. A method, comprising:
forming a first chamber and a second chamber between a substrate and a micro-electromechanical system (MEMs) substrate, wherein the first chamber abuts a first MEMs device within the MEMs substrate and the second chamber abuts a second MEMs device within the MEMs substrate;
forming a heating element separated from the first chamber by an out-gassing layer, wherein a horizontal plane extends through the heating element and sidewalls of the out-gassing layer that define the first chamber and the second chamber;
operating the heating element to generate heat that causes the out-gassing layer to release a gas that increases a first pressure within the first chamber to be greater than a second pressure within the second chamber; and
separating the substrate and the MEMs substrate into a first die having the first chamber and a second die having the second chamber after operating the heating element.

11. The method of claim 10, further comprising:
forming one or more semiconductor devices within the substrate;
forming a dielectric structure surrounding one or more conductive interconnect layers over the substrate, wherein the dielectric structure has sidewalls defining a first depression defining a lower surface of the first chamber and a second depression defining a lower surface of the second chamber; and
wherein the heating element is laterally offset from the first chamber and is not laterally separated from the first chamber by the one or more conductive interconnect layers.

12. The method of claim 10, wherein the out-gassing layer comprises a residue from an etching process or a planarization process.

13. The method of claim 10, further comprising:
increasing the first pressure within the first chamber to improve performance of the first MEMs device.

14. The method of claim 10, wherein the MEMs substrate has a substantially flat upper surface that continually extends from directly over the heating element past opposing sides of the heating element.

15. The method of claim 10, wherein either the first chamber or the second chamber is directly between the heating element and the MEMs substrate along a line.

16. The method of claim 10, wherein the first MEMS device and the second MEMS device are different types of MEMs devices.

17. The method of claim 10, further comprising:
bringing a capping substrate into contact with a side of the MEMs substrate facing away from the substrate, wherein the capping substrate comprises a semiconductor material that continually extends along a lateral surface and along sidewalls of the first chamber and the second chamber.

18. The method of claim 1, wherein the residue comprises a metal or a dielectric.

19. The method of claim 1, wherein the first heating element is arranged vertically between the first one of the plurality of hermetically sealed chambers and the semiconductor body.

20. The method of claim 1, wherein the first heating element is surrounded by a dielectric structure over the semiconductor body and the out-gassing layer further comprises the dielectric structure.

* * * * *